US005241604A

United States Patent [19]

Noguchi

[11] Patent Number: 5,241,604

[45] Date of Patent: Aug. 31, 1993

[54] SOUND EFFECT APPARATUS

[75] Inventor: Yutaka Noguchi, Kanagawa, Japan

[73] Assignee: Kabushiki Kaisha Toshiba, Kawasaki, Japan

[21] Appl. No.: 641,542

[22] Filed: Jan. 15, 1991

[30] Foreign Application Priority Data

Jan. 24, 1990 [JP] Japan .................................. 2-14420

[51] Int. Cl.[5] .............................................. H03G 3/00

[52] U.S. Cl. ........................................ 381/63; 381/86; 84/630; 84/DIG. 26

[58] Field of Search ....................... 381/86, 63; 84/630, 84/DIG. 26; 340/461

[56] References Cited

U.S. PATENT DOCUMENTS

| | | | |
|---|---|---|---|
| 3,217,080 | 11/1965 | Clark, Jr. * | 84/1.24 |
| 4,549,098 | 10/1985 | Fushiki | 307/352 |
| 4,611,344 | 9/1986 | Hayama et al. | 381/108 |
| 4,648,117 | 3/1987 | Kunungi et al. | 381/102 |
| 4,792,783 | 12/1988 | Burgess et al. | 340/461 |

OTHER PUBLICATIONS

Nagumo et al., "Digital Audio System", Toshiba Review, 1987, vol. 42, No. 12, pp. 908–910.

Kondo et al., "Digital Sound Processor for Sound Field Control LSI, TC9330N", Toshiba Review, 1987, vol. 42, No. 12, pp. 911–915.

*Primary Examiner*—Forester W. Isen

*Attorney, Agent, or Firm*—Foley & Lardner

[57] ABSTRACT

In a sound effect apparatus which processes audio signals, a volume controller controls the volume of sound and a preset volume is detected by a detector. A plurality of delay lines delay audio signals by different delay times. A plurality of level converters generate reverberation sounds by decreasing the level of the delayed audio signals. Generated reverberation sounds and the input audio signal are added. The values of the level to which signals are lowered in the level converters are changed equally in response to the detected volume. When the detected volume is smaller than a specified volume, the values of the level to which signals are lowered are equally decreased. When the detected volume is larger than a specified volume, the values of the level to which signals are lowered are equally increased.

6 Claims, 4 Drawing Sheets

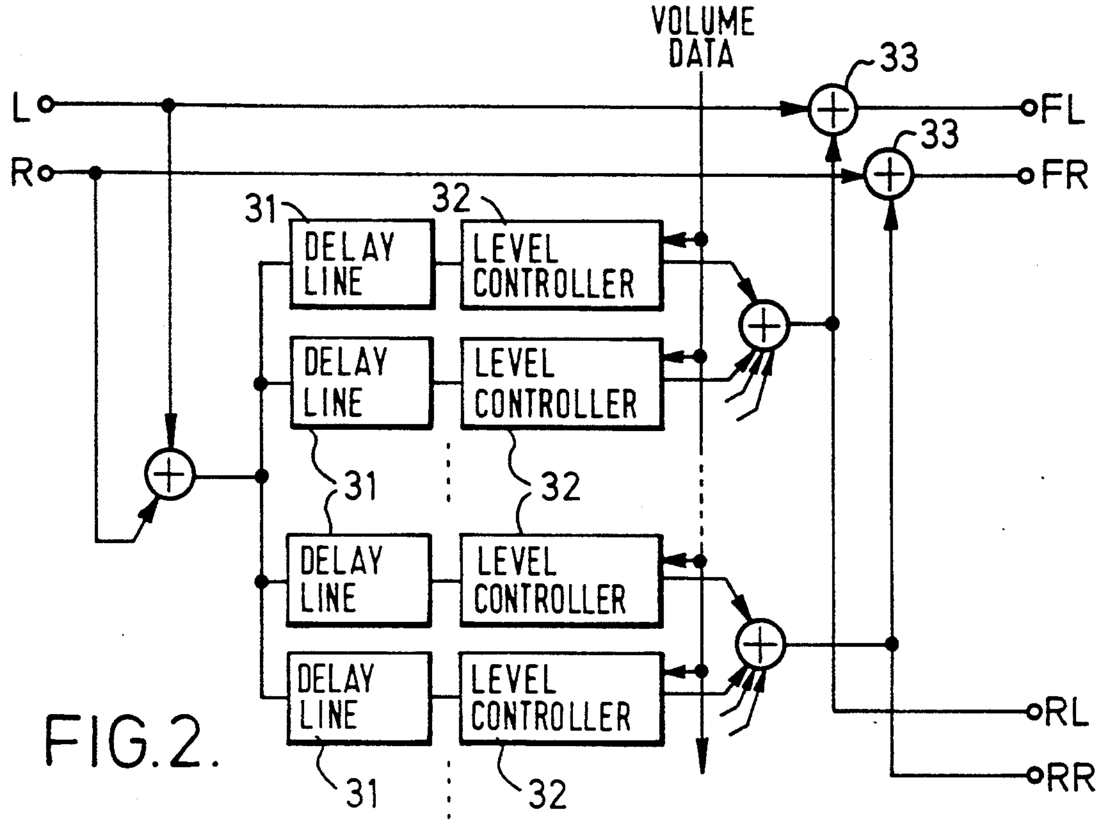
FIG.2.
FIG.6a.
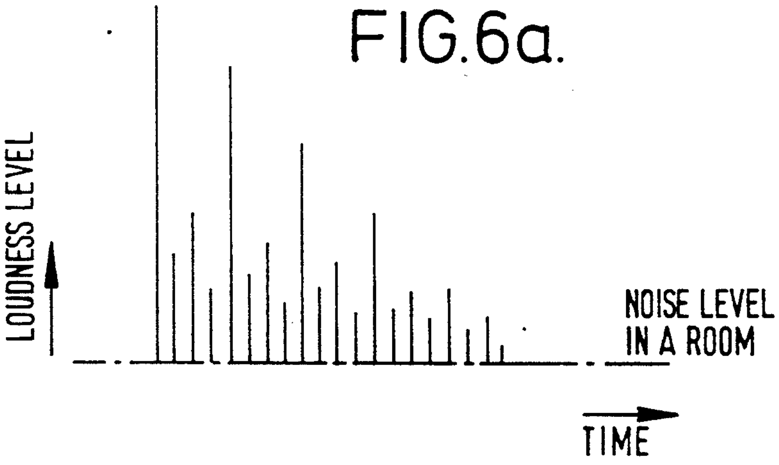
FIG.6b.
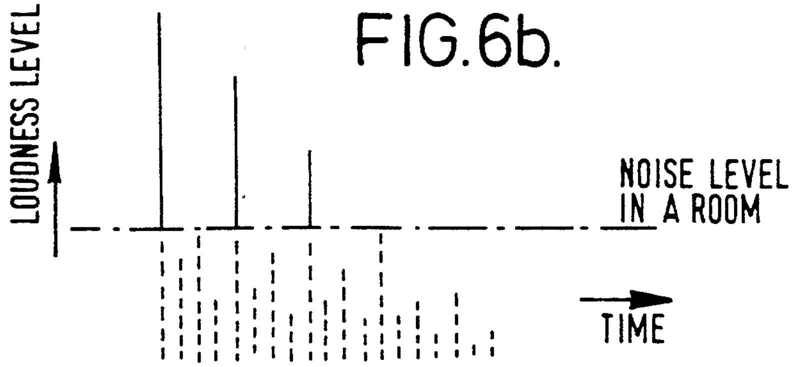

SOUND EFFECT APPARATUS

BACKGROUND OF THE INVENTION

1. Field of the Invention

The present invention relates, in general, to an audio signal processing apparatus, and more particularly to a sound effect apparatus which performs sound effect processing of an audio signal by using so-called digital sound processor.

2. Description of the Related Art

Recently, many remarkable technical developments have been made in the field of audio equipment. For example, stereophonic systems have been widely used in audio equipment. Digital systems also have been widely used for processing audio signals. These systems make the reproduced sound very similar to an original sound.

Furthermore, a sound effect processing apparatus capable of producing a specific reproduced sound field suitable to a listener's preference, by processing an audio source signal, such as a music signal, has been in great demand in recent years.

For meeting such a demand, there is a sound effect system using a digital sound processor which is called, for example, a surround system. In this surround system, various signal processes are performed for two channel input audio signals. Thus, by outputting four channel sounds, a sound field which surrounds listeners is formed.

For example, a digital sound processor for sound field control is described in "Digital Sound Processor for Sound Field Control LSI, TC9330N", TOSHIBA REVIEW Vol. 42, No. 12, 1987, by Atsushi Kondo, Kazuhito Nakanishi, Yoshihiro Iwamoto. Also, a digital audio system equipped with a digital sound processor is described in "Digital Audio System", TOSHIBA REVIEW, Vol. 42, No. 12, 1987, by Masahide Nagumo, Akira Sasaki, Yoh Yoshida.

Now, assuming a sound field like a concert hall, the acoustics of the hall is considered as an element in development of such a sound effect system. For producing a sound field filled with presence, various reverberation components are added to a basic sound. However, when such a sound, which assumes a specified sound field, is reproduced in a home, as shown in FIG. 5, composite sounds (shown in FIG. 5(*c*)) consisting of emitted sounds from a speaker (shown in FIG. 5(*a*)) and a reverberation sound which is a generated sound reflecting at, for example, a wall in a room (shown in FIG. 5(*b*)) are actually heard. Also, at the product developing stage, there is a necessity to capture low (fine) sounds so that the sound field is assumed to be on the basis of comparatively diverse sounds. However, generally in a home, sound is often listened to at reduced volume because of various restrictions. Therefore, the following problems occur. As shown in FIG. 6, when the volume is low, a low level component of the reverberation sound, e.g., a reverberation component which has a long delay time, is masked by room noise so that it cannot be heard. As a result, a sound without presence is heard in comparison with the sound field which is assumed at the time of developing the sound. On the contrary, if the sound is reproduced at a high volume relative to that at the time of developing the sound, an over acoustic occurs. As is understood from the Fletcher-Munson contour of well known human aural characteristics, in the case of a low level, it becomes too difficult to hear the treble and bass. As a result, the reproduced sound is deprived of power and clarity. As a technique which corrects such a poor sound, a volume control circuit, or the like, is well-known. However, only one correction for basic sound is not enough.

SUMMARY OF THE INVENTION

Accordingly, it is an object of the present invention to provide an audio effect apparatus which is capable of creating an outstanding sound effect for low volume reproduction.

It is a further object of the present invention to provide an audio effect apparatus which is capable of preventing an over acoustic for high volume effective reproduction.

In accordance with the present invention, the foregoing objects are achieved by providing a sound effect apparatus, including an input unit and an output unit for an audio signal, for processing audio signals. The sound effect apparatus includes a volume control unit for controlling the volume of sound, a detection unit for detecting the volume which is present due to the volume control unit, a plurality of delay units for delaying the input audio signals by different delay times, respectively, a plurality of level converting units for generating reverberation sounds by decreasing the level of the delayed audio signals, the level converting units corresponding in number to the delay units, an addition unit for adding the generated reverberation sounds to the input audio signal and a unit for changing essentially equally the value to which the level is decreased by the level converting units in response to the detected volume.

BRIEF DESCRIPTION OF THE DRAWINGS

These and other objects and advantages of this invention will become more apparent from the following detailed description of the presently preferred embodiment of the invention, taken in conjunction with the accompanying drawings of which:

FIG. 2 is a detailed block diagram showing a digital sound processor shown in FIG. 1;

FIG. 6(*a*) and 6(*b*) are diagrams explaining a change in reverberation characteristic when the volume level of basic sound is decreased wherein FIG. 6(*a*) shows a reverberation characteristic before the decrease and FIG. 6(*b*) shows a reverberation characteristic after the decrease.

DETAILED DESCRIPTION OF THE PREFERRED EMBODIMENT

The preferred embodiment of the present invention will now be described in more detail with reference to the accompanying drawings.

Figure 1:
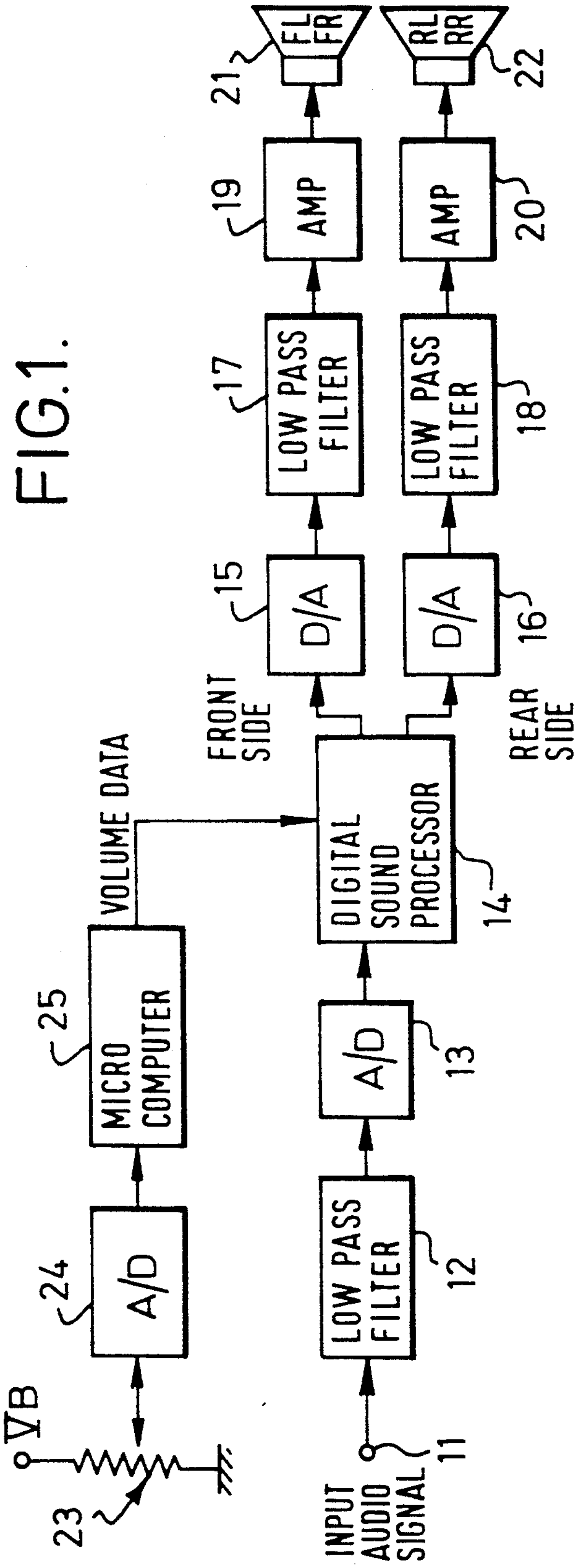
FIG. 1 is a block diagram showing an embodiment of a sound effect apparatus according to the present invention.

FIG. 1 shows a block diagram of a sound effect apparatus according to the present invention. In FIG. 1, an audio signal input terminal 11 receives an audio signal. The audio signal is supplied from a CD (Compact Disc) player, a tape player, VCR (Video Cassette Recorder) or LD (Laser Disc) player, etc. The audio signal is applied to an analog to digital converter 13 (referred to as an A/D converter hereafter) through a low pass filter 12 (referred to as a LPF hereafter). The LPF 12 removes undesired high frequency components (referred to as HF or HF components) from the audio signal. The audio signal output from the LPF 12 is analog. The A/D converter 13 converts the analog audio signal to a digital audio signal. The digital audio signal is applied to a digital sound processor 14 (referred to as DSP hereafter). In the DSP 14, a reverberation effect process is performed by adding a reverberation signal to the audio signal. The reverberation sound signals thus produced, for example, correspond to reverberation sounds in a concert hall or other sound fields.

The reverberation sound signals are converted into analog reverberation sound signals by digital to analog converters 15 and 16 (referred to as D/A converters hereafter). The analog reverberation sound signals are applied to amplifiers 19 and 20 through LPF's 17 and 18. The LPF's 17 and 18 remove undesired HF components from the analog reverberation sound signals. The amplifiers 19 and 20 amplify the reverberation sound signals and then supply the signals to loudspeakers 21 and 22. Here, FIG. 1 shows a one channel of the audio signal processing apparatus for convenience. However, the audio signal processing apparatus generally includes two channels for processing stereophonic related signals. Then, actually four loudspeakers are arranged at the front left and right and rear left and right. Thus, the loudspeakers give a specific sound effect for listeners according to the reverberation sound signals. A volume control 23 performs volume control by the rotational position of an adjusting terminal. The divided voltage obtained by the adjusting terminal of the volume control 23 is applied to a microcomputer 25 through an A/D converter 24. The microcomputer 25 is conventional in design and construction. The microcomputer 25 detects the volume data. The volume data which is detected by the microcomputer 25 is supplied to the DSP 14.

FIG. 2 shows a block diagram of the DSP 14. As shown in FIG. 2, the DSP 14 includes a plurality of delay lines 31, a plurality of level controllers 32 and adders 33. The delay lines 31 delay the sound signal at different delay times, respectively. The level controllers 32 are provided corresponding in number to the delay lines 31, respectively. The level controllers 32 produce the reverberation sound signal by decreasing the levels of the audio signals which are input through the delay lines 31. The adders 33 add each reverberation sound signal produced to the audio signal.

In the DSP 14, the following three conditions are set, beforehand:

1) the delay time of each delay line 31,
2) the value of a decrease in the volume level by each level controller 32, and
3) the number of combinations of the delay line 31 and the level controller 32 which are used.

However, in these set conditions, each value of decreased volume by each level controller 32 is changeable equally in response to the volume data which is detected by the microcomputer 25, respectively.

Figure 3:
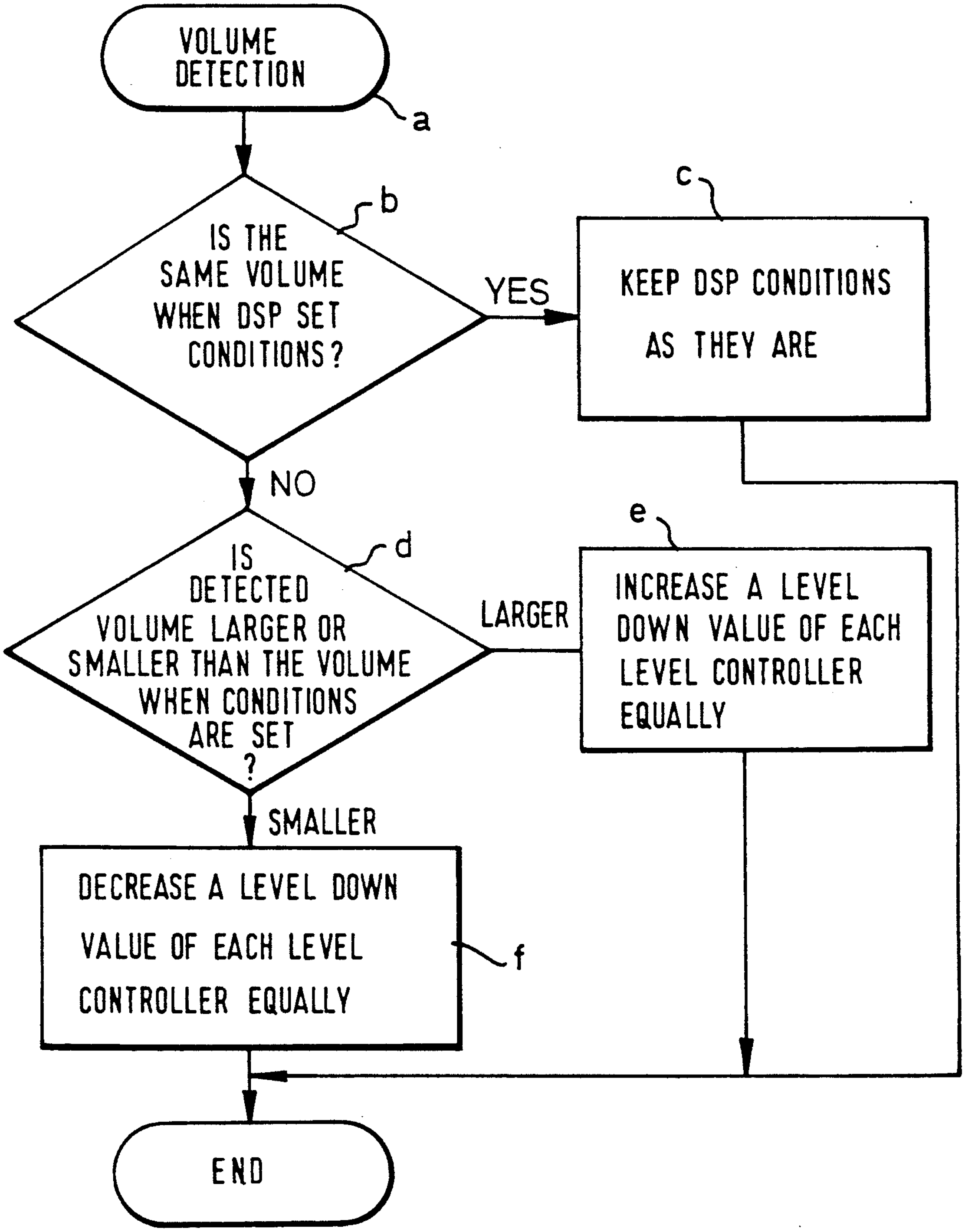
FIG. 3 is a flow chart showing varying control of the value to which the level is decreased in a level controller shown in FIG. 2.
Figure 5A:
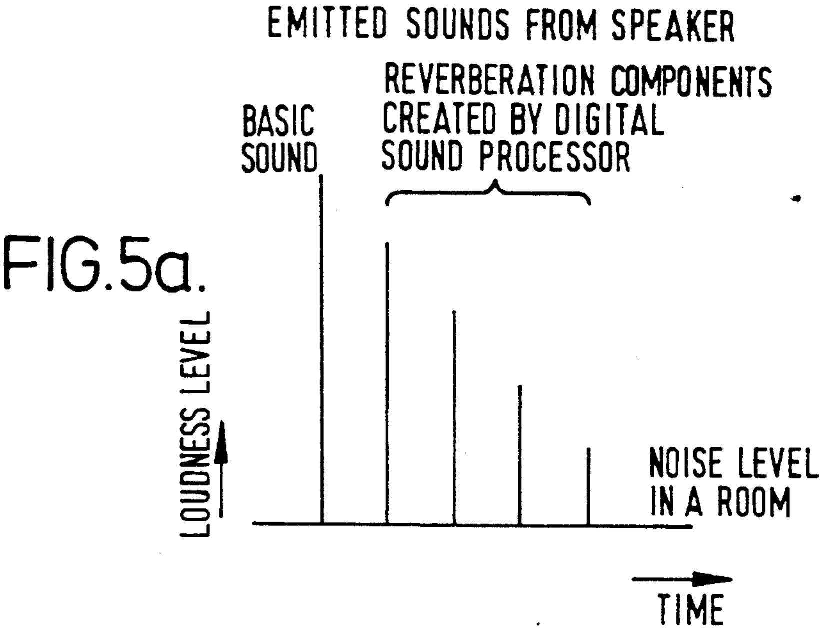
FIGS. 5(*a*), 5(*b*) and 5(*c*) are diagrams explaining a reverberation characteristic in a general home wherein FIG. 5(*a*) shows emitted sounds from a speaker and FIG. 5(*b*) shows the acoustics of a room and FIG. 5(*c*) shows sounds heard in a general home.
Figure 5B:
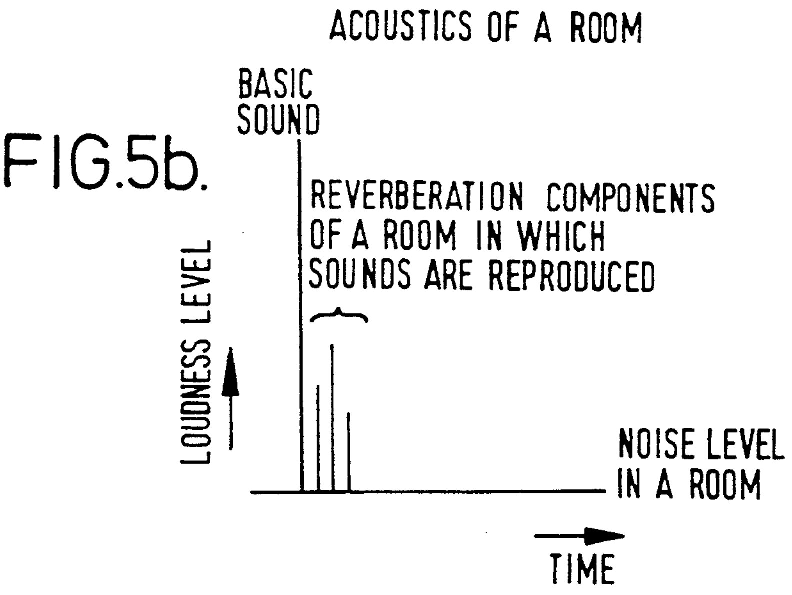
Figure 5C:
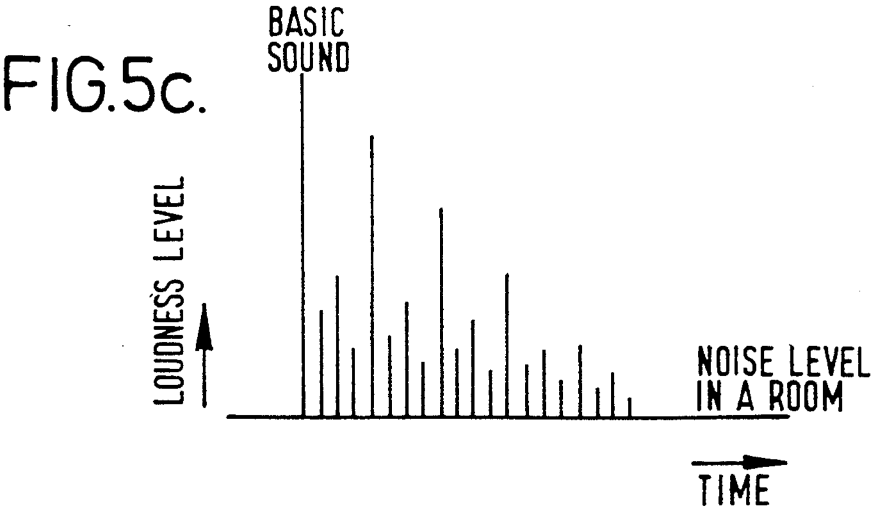

Next, the operation of the above-described DSP 14 will now be described using the flow chart shown in FIG. 3. In step a, a volume is set by the volume control 23. The volume set is detected by the microcomputer 25.

Then, the volume data is input to each level controller 32 of the DSP 14. Next, in step b, each level controller 32 judges whether the detected volume data from the microcomputer 25 is equal to the volume when the DSP 14 set conditions or not. In step c, when both volumes are equal, the conditions of the DSP 14 are not changed. On the other hand, in case the volume when the DSP 14 set conditions is not equal to the detected volume, in step d, the level controller 32 judges whether the detected volume is larger or smaller than the volume when the conditions were set. As a result, when the detected volume is judged to be larger than the volume which was set by the DSP 14, in step e, each level controller 32 increases equally from the set point the value of the level to which a respective audio signal is lowered.

Conversely, when the detected volume data is judged to be smaller than the volume which is set by the DSP 14, in step f, each level controller 32 decreases equally from the set point the value of the level to which a respective audio signal is lowered. A change of the value of the level to which a signal is lowered in each level controller 32, for example, is performed continuously or by stages in response to a difference between the volume level when the conditions are set and the detected volume data.

Figure 4B:
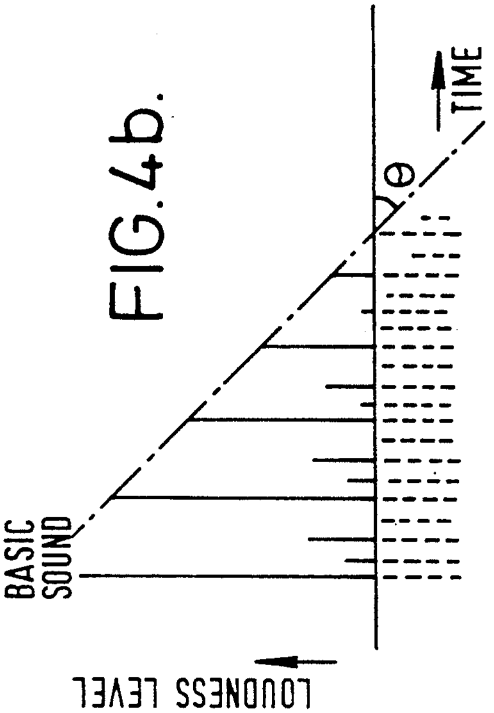
FIGS. 4(*a*) and 4(*b*) are diagrams explaining the sound effect apparatus shown in FIG. 1 wherein FIG. 4(*a*) shows a reverberation sound before receiving level control and FIG. 4(*b*) shows a reverberation sound after receiving level control.
Figure 4A:
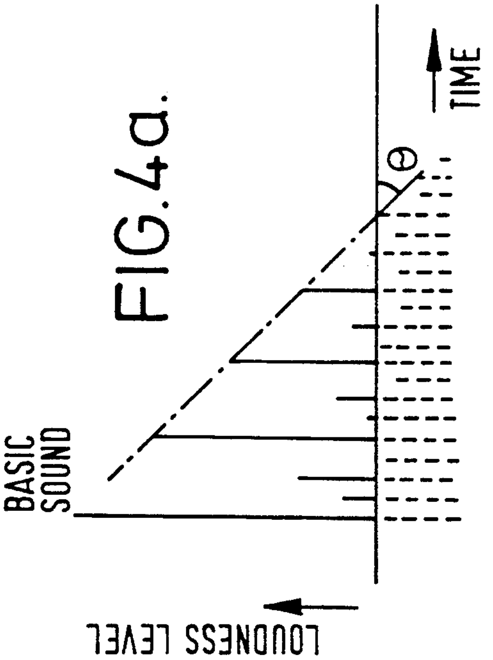

Thus, as shown in FIG. 4, the reverberation signal levels for sound reproduction at a small volume setting are raised equally. As a result, a reverberation component which has a long delay time and is at a low level is able to remain in the reproduced sound. Furthermore, an over acoustic when a sound is reproduced at a large volume is effectively prevented.

Although in above-mentioned embodiment, the present invention is applied to an apparatus which has a volume control equipped with an adjusting terminal, it would be possible to apply it to an apparatus which has an electronic control volume. The microcomputer also could possibly include the A/D converter.

Numerous other modifications and variations of the present invention are possible in light of the above teachings. It is therefore to be understood that, within the scope of the appended claims, the present invention can be practiced in a manner other than as specifically described herein.

What is claimed is:

1. A sound effect apparatus, including input means and output means, for processing input audio signals, comprising:

volume control means for controlling a volume of sound;

detection means for detecting control of said volume control means to produce a volume control signal;

a plurality of delay means for delaying said input audio signals by different delay times, respectively, to produce delayed audio signals;

a plurality of level converting means for generating reverberation sounds by decreasing said delayed audio signals to predetermined levels, said level converting means being provided in number corresponding to said delay means; and addition means for adding said reverberation sounds to said input audio signals;

said level converting means changing essentially equally the value of said levels of only said delayed audio signals in response to said volume control signal.

2. An apparatus as cited in claim 1, wherein said volume control means is an adjusting terminal type volume control.

3. An apparatus as cited in claim 1, wherein said volume control means is an electronic volume control.

4. An apparatus as cited in claim 1, said detection means is a microcomputer.

5. A sound effect apparatus, including input means and output means, for processing input audio signals, comprising:

volume control means for controlling a volume of sound;

detection means for detecting control of said volume control means to produce a volume control signal;

a plurality of delay means for delaying said input audio signals by different delay times, respectively, to produce delayed audio signals;

a plurality of level converting means for generating reverberation sounds by decreasing said delayed audio signals to predetermined levels, said level converting means being provided in number corresponding to said delay means; and addition means for adding said reverberation sounds to said input audio signals;

said level converting means changing essentially equally the value of said levels of only said delayed audio signals, wherein value of said level is changed continuously in response to said volume control signal.

6. A sound effect apparatus, including input means and output means, for processing input audio signals, comprising:

volume control means for controlling a volume of sound;

detection means for detecting control of said volume control means to produce a volume control signal;

a plurality of delay means for delaying said input audio signals by different delay time, respectively, to produce delayed audio signals;

a plurality of level converting means for generating reverberation sounds by decreasing said delayed audio signals to predetermined levels, said level converting means being provided in number corresponding to said delay means; and addition means for adding said reverberation sounds to said input audio signals;

said level converting means changing essentially equally the value of said levels of only said delayed audio signals, wherein said value of said level is changed in stages in response to said volume control signal.

* * * * *